United States Patent [19]
Smith, Jr.

[11] 3,811,076
[45] May 14, 1974

[54] FIELD EFFECT TRANSISTOR INTEGRATED CIRCUIT AND MEMORY

[75] Inventor: William Michael Smith, Jr., Williston, Vt.

[73] Assignee: International Business Machines Corporation, Armonk, N.Y.

[22] Filed: Jan. 2, 1973

[21] Appl. No.: 320,395

[52] U.S. Cl. ...... 317/235 R, 307/238, 340/173 CA, 317/235 G, 317/235 AT, 317/235 AH
[51] Int. Cl. ........................................ H01l 19/00
[58] Field of Search .. 317/235 G, 235 AT, 235 AH; 340/173 CA

[56] References Cited

UNITED STATES PATENTS

| | | | |
|---|---|---|---|
| 3,387,286 | 6/1968 | Dennard | 317/235 |
| 3,602,782 | 8/1971 | Klein | 317/235 |
| 3,720,922 | 3/1973 | Kosonocky | 317/235 |

OTHER PUBLICATIONS

Electronics Letters, "Suppression of Parasitic Thick-Field Conduction Mechanisms . . . " by Richman, January 1971, page 12–13.

*Primary Examiner*—Jerry D. Craig
*Attorney, Agent, or Firm*—Daniel E. Igo

[57] ABSTRACT

An integrated circuit structure of a field effect transistor (FET) serially connected to a capacitor has the capacitor formed by one of the current flow electrodes of the FET and by a polycrystalline silicon (polysilicon) field shield. The structure includes, in a semiconductor (e.g., silicon) substrate, of, e.g., *p*-type conductivity, two spaced regions of opposite conductivity type to that of the substrate, e.g., *n*-type. One of the spaced regions serves as a first plate of the capacitor and as a first current flow electrode of the FET. The other region serves as a second current flow electrode of the FET. A first insulating layer on the substrate has a polysilicon layer on it covering the two spaced regions and is directly and ohmically electrically connected to the substrate. The portion of the polysilicon layer over the spaced region serving as the first plate of the capacitor serves as the second plate of the capacitor. A second insulating layer covers the polysilicon layer and a second layer of conducting material, e.g., aluminum, is provided on the second insulating layer. The second conductive layer overlies the space between the two spaced regions and serves as a gate electrode for the FET. When employed as a memory circuit, the spaced region of opposite conductivity type to the substrate which does not serve as the first plate of the capacitor is desirably a diffused bit/sense line and the second conducting layer serves as a word line.

8 Claims, 2 Drawing Figures

FIELD EFFECT TRANSISTOR INTEGRATED CIRCUIT AND MEMORY

CROSS REFERENCE TO RELATED APPLICATION

A co-pending, concurrently filed, commonly assigned application by Richard R. Garnache and William M. Smith, Jr., Ser. No. 320,394. entitled "Integrated Circuit Fabrication Process" covers a method for making the structure described and claimed herein.

BACKGROUND OF THE INVENTION

1. Field of the Invention

This invention pertains to an integrated circuit structure. More particularly, it relates to an integrated circuit structure for a circuit including an FET serially connected to a capacitor. The integrated circuit structure of this invention is particularly suited for large capacity memory applications.

2. Description of the Prior Art

FET memories in which the memory storage cell consists of a capacitive storage element gated by a single FET are known in the art. For example, commonly assigned Dennard, U.S. Pat. 3,387,286 discloses such a memory. Such a combination of one active circuit element and one passive circuit element provides a very simple memory cell. Due to the presence of only a single FET in the memory cell, it has been termed a "one-device" cell. Although the teachings of the Dennard patent have been available for several years, such a simplified memory cell is just now beginning to achieve commercial exploitation as integrated circuit fabrication technology has become sophisticated enough to exploit many of the potential advantages of such a simple structure.

Presently available data processing memory systems include a rapid ferrite core or integrated circuit main memory in which data to be utilized by a data processing system is stored. In addition, off-line electromechanically accessed bulk storage media, such as magnetic discs or tapes provide capacity for storage of very large amounts of information, measured in billions of bits. While the technology of such electromechanically accessed storage devices has been highly developed in order to make access to information stored in them as rapid as possible, even the most rapidly accessed discs are extremely slow when compared with main memory access times, measured in nanoseconds ($1 \times 10^{-9}$ second). Even under the most favorable circumstances, access times of such off-line large capacity storage units is measured in milliseconds ($1 \times 10^{-3}$ second). The vast differences in memory capacity and memory access time between data processing main memories and the electromechanically accessed bulk storage units results in what has been termed the "file gap." A need therefore exists for a memory unit that is intermediate in speed between presently available, relatively expensive main memories and relatively inexpensive, slow, electromechanically accessed bulk storage units. In fact, the provision of a memory suited to fill this "file gap" might tend to replace some of the memory capacity of each present category.

The advantages of such a memory intermediate between present main memories and large capacity memories are presently recognized. However, the provision of such a memory in integrated circuit form places very great demands on integrated circuit technology. Such a memory should contain from 10 to 100 million storage cells, each capable of storing 1 bit of information. In order to be competitive with the highest performance electromechanically accessed memories, such an intermediate memory must be at least two orders of magnitude less expensive than present day integrated circuit main memories. These requirements indicate that an integrated circuit suitable for such a large capacity memory must be both very dense and simple to fabricate.

Increasing the density of an integrated circuit usually results in increasing the complexity of its fabrication. This results because it becomes necessary to take extra steps to avoid spurious signals in one circuit element induced by another adjacent circuit element which may, for example, form part of another storage cell in an integrated circuit memory. Further, leakage currents become more serious as individual circuit elements become smaller in size. An example of extra structure introduced into an integrated circuit for the purpose of avoiding spurious signals for adjacent elements and leakage currents is the polysilicon field shield disclosed in U.S. Pat. No. 3,602,782. While such a field shield is highly effective for accomplishing its intended purpose, the provision of an extra element in an integrated circuit structure increases fabrication complexity and cost. Thus, a need remains for an integrated circuit structure suitable for use in large capacity memories of the type required to fill the file gap.

SUMMARY OF THE INVENTION

Accordingly, it is an object of this invention to provide a field shielded integrated circuit including a field effect transistor and a capacitor in series, which is small in size and of simplified construction.

It is another object of the invention to provide an integrated circuit memory cell of reduced size that is easily fabricated.

It is a further object of the invention to provide a one device cell memory in which stray currents and leakage currents are minimized, thus allowing a reduction in cell size without risk of spurious information being sensed as a result of stray currents or loss of stored information due to leakage currents.

It is still another object of the invention to provide an integrated circuit in which a conductive member serves both as one plate of a capacitor and as a field shield.

The above and related objects may be attained with the present integrated circuit structure and memory. The integrated circuit includes an FET having two current flow electrodes formed as spaced apart but adjacent regions of a first conductivity type material in a semiconductor substrate of a second conductivity type. A capacitor is series connected to the FET. A first one of the electrodes of the capacitor is formed by one of the first conductivity type FET current flow electrode regions. An insulating layer is on the semiconductor substrate. A conducting member is disposed on the insulating layer and is electrically connected to the substrate to create a field shield, i.e., by a direct and ohmic connection. Alternatively, this conducting member may be connected to another source of a suitable field shield bias. This conducting member, by a portion of it overlying the first conductivity type region serving as the first electrode of the capacitor, forms a second electrode of the capacitor. The conducting member desirably comprises a layer of poly-crystalline semiconductor, such as silicon. Usually, a second insulating layer is provided over the polycrystalline semiconductor. An opening is provided down to the first insulating layer at the space between the two spaced apart regions of first conductivity type. A second conducting member is then provided on the second insulating member and at the opening down to the first insulating layer, to serve as a gate electrode of the FET. If used in a memory array, the spaced apart first conductivity type region which does not serve as an electrode of the capacitor is desirably a diffused bit/sense line for the memory. The second conducting member, usually a metal such as aluminum, serves as a word line for the memory in addition to being the gate electrode at the space between the two spaced apart first conductivity type regions.

Its density and ease of fabrication make the present integrated circuit structure ideally suited for a large capacity integrated circuit memory used to fill the file gap. These features of the structure also make it of potential value in a wide variety of other integrated circuit applications in which an FET serially connected to a capacitor is required.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
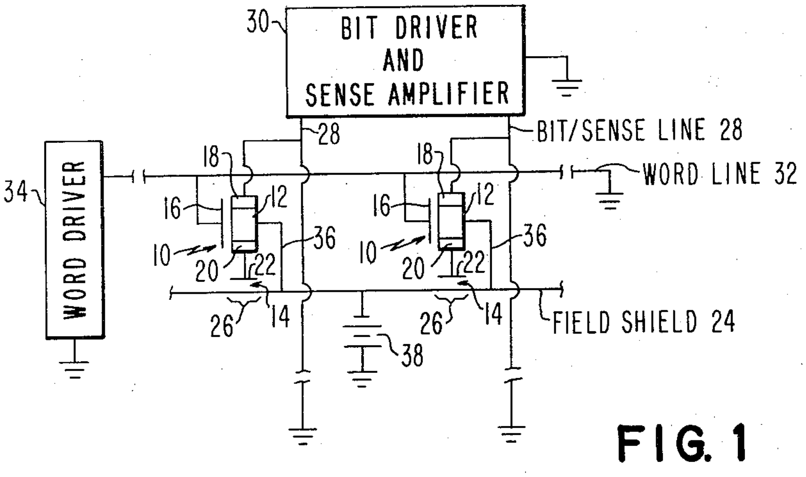
FIG. 1 is a schematic diagram of two memory storage cells in accordance with the invention.

Turning now to the drawings, more particularly to FIG. 1, each memory cell 10 has an FET 12 and a storage capacitor 14. Each FET 12 has a gate electrode 16 and two current flow electrodes 18 and 20. Capacitors 14 are connected to FET's 12 in series by their electrodes 22. Field shield 24 forms the other electrode of capacitor 14 in the regions 26 coextensive with electrode 22.

Current flow electrodes 18 of FET's 12 are connected to bit/sense lines 28 to connect each storage cell 10 to bit driver and sense amplifier 30. Gates 16 of each FET are connected to word line 32 to connect each cell to word driver 34. Field shield 24 is connected to FET's 12 by lines 36. Field shield 24 is kept at a predetermined potential, as indicated by the presence of battery 38.

In operation, the presence or absence of a charge on capacitors 14 is utilized to store information in the memory cells 10. To introduce a charge on capacitors 14, coincident pulses are supplied by word driver 34 on a word line 32 of the memory and by bit driver portion of bit driver and sense amplifier 30 on a bit line 28. The pulse on word line 32 must be of sufficient magnitude to exceed the threshold voltage of FET's 12, thus allowing current flow from the pulse supplied on a bit line 28 to be supplied through the device to charge a capacitor 14. At the conclusion of the pulse on word line 32, FET's 12 turn off, trapping a charge on capacitor 14 that has been applied by a coincident pulse on bit line 28.

To read information out of memory cells 10, a pulse is provided on word line 32 by word driver 34. As before, this turns on FET's 12, allowing the charge, if any, on capacitors 14 to be removed in the form of signals on bit lines 28. In this manner, all of the memory cells 10 connected to a given word line 32 are read out simultaneously. Signals so supplied on bit lines 28 are detected by the sense amplifier portion of bit driver and sense amplifier 30.

Since the information is stored in the memory of FIG. 1 as a charge or the absence thereof on capacitors 14, it is necessary to refresh the information periodically in order to prevent loss of the information through decay of the charge. This is done as known in the art by reading the information out of the capacitors 14, usually one word line at a time, then writing the information back into the memory. For example, restoration of the information stored on capacitors 14 can be carried out in the manner described in a commonly assigned application by Stephen B. Behman and Stephen Goldstein, Ser. No. 298,917, or Robert D. Anderson, Jr. and Howard L. Kalter, Ser. No. 298,918, both filed Oct. 19, 1972, the disclosures of which are incorporated by reference herein.

Further details on the operation of a one device cell FET memory are available in the above-referenced Dennard, U.S. Pat. No. 3,387,286, the disclosure of which is also incorporated by reference herein. In addition to the operator disclosed there, a preset pulse on the bit line 28 beginning prior to application of a pulse on word line 32 and continuing until the conclusion of a read operation may be substituted for either maintaining the bit line at ground or at a constant bias, as disclosed by Dennard.

Figure 2:
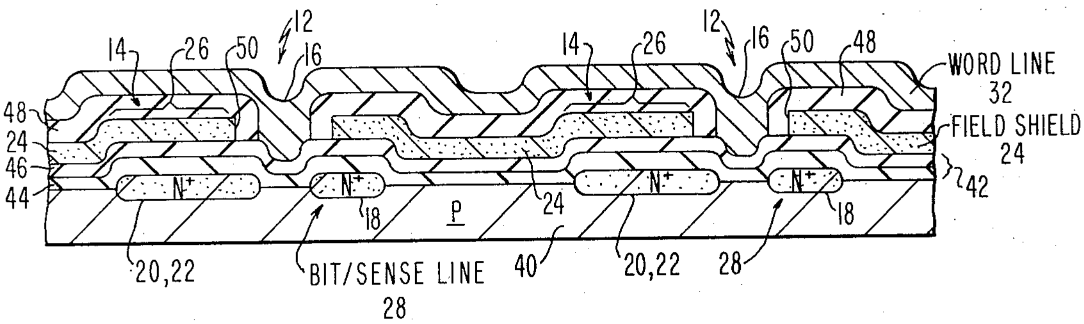
FIG. 2 is a cross-section of an integrated circuit structure in accordance with the invention of the two memory storage cells shown schematically in FIG. 1.

Turning now to FIG. 2, a cross section of an integrated circuit structure of the two memory cells 10 shown in FIG. 1 is depicted. For ease of understanding, corresponding elements in FIGS. 1 and 2 have been given the same reference numbers. The structure is formed on a *p*-type silicon substrate 40. Bit/sense line 28 is formed as a diffused strip, the portion 18 of which forms the current flow electrodes 18 of FET's 10. The other diffusions 20, 22 form the other current flow electrodes 20 of FET's 10 as well as the electrodes 22 of capacitors 14. Disposed over the entire surface of substrate 40 is a composite insulating layer 42. Composite insulating layer 42 includes a layer 44 of silicon dioxide next to silicon substrate 40 and a layer 46 of silicon nitride above the silicon dioxide. The thickness of composite insulating layer 42 is desirably between about 400 A and about 1,000 Angs. Above insulating layer 42 is the poly-silicon field shield 24, desirably having a thickness between about 2,000 and 5,000 Angstroms. Field shield 24 is a single member having openings in the space between current flow electrodes 18 and 20 of the FET's 10, as shown. Portions 26 of the polysilicon field shield 24 also form electrodes 26 of the capacitors 14. This dual use of the polysilicon layer 24 helps to give a simplified, highly effective one device FET memory cell. Second insulating layer 48 is provided over polysilicon field shield 24 and capacitor electrode 26. Second insulating layer 48 is considerably thicker than first insulating layer 42, and may be, for example, 2,500 Angs. in thickness. It should be noted that, in addition to covering the top surface of polysilicon layer 24, second insulating layer 48 also covers edge 50 of the layer 24. This serves to insulate polysilicon layer 24 completely from second conductive layer 32, an aluminum pattern, having a thickness of between 5,000 and 10,000 Angs. and forming the word lines of the memory storage circuits 10 shown, as well as gates 16 of the FET's 12.

A suitable process for fabricating the integrated circuit structure shown in FIG. 2 is the subject matter of a co-pending, concurrently filed, commonly assigned application by R. R. Garnache and W. M. Smith, Jr., entitled "Integrated Circuit Fabrication Process," the disclosure of which is incorporated by reference herein. Summarizing that process briefly, the diffusions 18 and 20, 22 are formed in the silicon substrate 40 by depositing a doped oxide containing a suitable donor impurity, such as arsenic. The doped oxide is etched from the surface except where the diffusions are to occur. A second, undoped oxide layer is thermally grown over the substrate 40 and remaining doped oxide, with dopant from the doped oxide simultaneously diffusing into areas of the substrate underlying the doped oxide. The undoped oxide serves to prevent autodoping. Both oxide layers are then removed, leaving slight steps, typically of about 1,000 Angs., at the surface of silicon substrate 40 corresponding to substrate material that was oxidized to form the second, undoped oxide layer. The thin oxide composite 42 of silicon dioxide layer 44 and silicon nitride layer 46 and polysilicon layer 24 are then formed, desirably by chemical vapor deposition, which may be carried out in a single chemical vapor deposition process tube. The layer 24 is desirably doped to the same extent as *p*-type silicon substrate 40, with a suitable acceptor impurity, such as boron. Openings are then etched in the polysilicon layer 24 at the spaces between diffusions 18 and 20, 22 to allow formation of the gate electrodes 16 of the FET's 12, contact from the field shield to the substrate, and contact of the interconnection metallization to diffusions in peripheral circuits. Silicon dioxide second insulating layer 48 is then thermally grown on the polycrystalline silicon layer 24, including along its edges 50. No thermally grown oxide forms on the exposed surface of silicon nitride layer 46 in the areas of gates 16. Contact holes are then made to diffusions in the substrate and to the substrate itself. Aluminum conducting line 32 is then vacuum evaporated and etched to form the desired word lines. Further details are available in the referenced Garnache and Smith application.

If desired, an alternative process may be used to prepare a structure similar to that shown in FIG. 2. Thus, a thin thermal oxide can be grown on a *p*-type silicon substrate. A thin silicon nitride layer is then chemical vapor deposited on the thin oxide. A diffusion pattern is etched through the nitride and thin thermal oxide and a donor impurity, such as phosphorous or arsenic is diffused through the openings to produce *n*-type regions forming the current flow electrodes of the FET as portions of a diffused bit line and one plate of the storage capacitors as the other current flow electrode of the FET. A thin thermal oxide is then grown over the diffusions, followed by the chemical vapor deposition and diffusion of a polysilicon layer. The polysilicon is then etched to give the desired field shield pattern. If desired, remaining silicon nitride may be removed by etching except where covered by the polysilicon field shield and where gates in the FET device are desired. Also, if desired, the original silicon nitride and thermal oxide layer can be etched out of the gate areas and a new thin oxide of desired thickness regrown. This step may be desired to allow some design flexibility by providing a different insulating layer thickness for the gate oxide and between the portion of the polysilicon field shield serving as one electrode of the capacitor and the current flow electrode of the FET serving as the other capacitor. A thermal oxide is then grown over the polysilicon field shield. Contact holes are then etched in this oxide at the periphery of the silicon substrate, an aluminum layer to serve as the word lines and gates of the FET's is vacuum evaporated, and then it is etched in a conventional manner.

In practice, storage cells in accordance with the invention having an area of 0.34 sq. mils with a storage capacitance of 0.07 picofarod can be fabricated as a memory array containing 32,000 bits together with on chip decode and other support circuits in a silicon chip having dimensions of 162 by 182 mils. These memory circuits give an average output signal of 35 mv. when sensed. Because the circuits contain the field shield, no stray signals which might be confused with an information pulse are detected and leakage currents are typically measured in $1 \times 10^{-14}$ amperes at room temperature. This enables the memory to be regenerated only once in each 10 cycles, assuring a high availability.

It should now be apparent that an FET integrated circuit structure and memory capable of attaining the stated objects of the invention has been provided. It should be recognized that an actual large capacity memory employing the integrated circuit structure of this invention may contain from 10 to 100 million or more of the memory cells, two of which have been depicted in this application. The integrated circuit structure is simple in its fabrication, highly reliable in operation and is able to meet the needs of the file gap between present day data processing system main memories and off line electromechanically accessed bulk storage devices.

While the invention has been particularly shown and described with reference to a preferred embodiment thereof, it will be understood by those skilled in the art that various changes in form and details may be made therein without departing from the spirit and scope of the invention. For example, the field shield member may be biased to a different level than the substrate. In the case of a *p*-type grounded substrate, a negative bias could be applied to the field shield.

What is claimed is:

1. An integrated circuit comprising:

A. a field effect transistor having a gate area and current flow electrodes of first conductivity type material in a semiconductor substrate of second conductivity type;

B. a capacitor series connected to said field effect transistor, a first one of the plates of said capacitor being formed by one of the first conductivity type current flow electrodes;

C. an insulating layer on the semiconductor substrate; and

D. a first conducting means disposed on said insulating layer forming a field shield over substantially the entire surface of said semiconductor substrate outside said gate area and overlaying a portion of said first conductivity type current flow electrodes to form a second one of the plates of said capacitor, thereby acting dually as a field shield and capacitor plate, and a second conducting means coupled to said gate area and lying in a substantially superimposed plane and insulated from said first conducting means.

2. The integrated circuit of claim 1 in which the said first conducting means is polycrystalline silicon.

3. The integrated circuit of claim 1 in which the said first conducting means has a direct ohmic connection to the semiconductor substrate and means of applying a reference voltage.

4. An integrated circuit of claim 1 wherein said insulating layer is a composite of silicon dioxide and silicon nitride.

5. An integrated circuit of claim 1 wherein said second conducting means is coupled to said gate area through an opening in said first conducting means.

6. An integrated circuit memory comprising:

A. an array of storage cells comprising field effect transistors having a gate area and current flow electrodes of a first conductivity type in a semiconductor substrate of a second conductivity type having an insulating layer thereon, a capacitor series connected to one of the said first conductivity type current flow electrodes and the first conductivity type electrode to which said capacitor is connected serving as a first plate of the capacitor, a first conducting means disposed on said insulating layer forming a field shield over substantially the entire surface of said semiconductor substrate outside said gate area and overlaying a portion of said first conductivity type current flow electrodes area to form a second one of the plates of said capacitor, thereby acting dually as a field shield and capacitor plate, a second conducting means coupled to said gate area and lying in substantially a superimposed plane and insulated from said first conducting means;

B. a plurality of bit lines each connected to the current flow electrode of the field effect transistor other than said electrode forming the capacitor plate; and C. a plurality of word lines each connected to said second conducting means of a group of the field effect transistors.

7. The memory of claim 6 in which said first conducting means dually acting as a capacitor plate and field shield comprises a layer of polycrystalline silicon.

8. The memory of claim 7 in which the semiconductor substrate is *p*-type silicon, the spaced apart regions are *n*-type silicon, and said first conducting means has a direct, ohmic connection to the silicon substrate.

* * * * *